(12) United States Patent
Sone et al.

(10) Patent No.: US 8,349,978 B2
(45) Date of Patent: *Jan. 8, 2013

(54) BLOCK POLYMER AND DEVICE

(75) Inventors: Takeyuki Sone, Tokyo (JP); Otto Albrecht, Atsugi (JP); Koji Yano, Kawasaki (JP); Sotomitsu Ikeda, Yokohama (JP); Yoichi Otsuka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 82 days.

This patent is subject to a terminal disclaimer.

(21) Appl. No.: 12/842,127

(22) Filed: Jul. 23, 2010

(65) Prior Publication Data
US 2010/0286335 A1 Nov. 11, 2010

Related U.S. Application Data

(60) Division of application No. 12/390,783, filed on Feb. 23, 2009, now Pat. No. 7,786,235, which is a continuation of application No. PCT/JP2008/066011, filed on Aug. 29, 2008.

(30) Foreign Application Priority Data

Aug. 31, 2007 (JP) ................. 2007-227020
Aug. 20, 2008 (JP) ................. 2008-212169

(51) Int. Cl.
*C08F 38/00* (2006.01)
(52) U.S. Cl. ........ 526/285; 528/337; 526/310; 252/500; 252/519.33
(58) Field of Classification Search .................. 526/285, 526/310; 252/500, 519.33; 528/337
See application file for complete search history.

(56) References Cited

U.S. PATENT DOCUMENTS

| | | |
|---|---|---|
| 6,291,606 B1 | 9/2001 | Tang et al. |
| 2005/0154164 A1 | 7/2005 | Tabata |

FOREIGN PATENT DOCUMENTS

| | | | |
|---|---|---|---|
| JP | 60-187304 A | 9/1985 |
| JP | 62-260808 A | 11/1987 |
| JP | 63-275614 A | 11/1988 |
| JP | 6-163049 A | 6/1994 |

(Continued)

OTHER PUBLICATIONS

Minoru Isomura et al., "Living Polymerization and Block Copolymerization of Various Ring-substituted Phenylacetylenes by Rhodium-based Ternary Catalyst," 45 Polymer Bulletin 335-39 (2000).

(Continued)

*Primary Examiner* — Shane Fang
(74) *Attorney, Agent, or Firm* — Fitzpatrick, Cella, Harper & Scinto

(57) ABSTRACT

The invention provides a block polymer capable of being used as a molecular wire facilitating injection of carriers between itself and an electrode, and a device in which electrodes are bridged by one molecule. The block polymer has a main chain composed of polyacetylene having a spiral structure, and includes a coating insulating block and a conductive block. The coating insulating block has a polyacetylene unit structure having alkyl chains at its side chains through functional groups, the alkyl chains being arranged in a direction parallel to the major axis of the main chain. The conductive block has a polyacetylene unit structure having hydrogen atoms at its side chains through functional groups, the hydrogen atoms being arranged in a direction parallel to the major axis of the main chain. The device has the above-mentioned block polymer, and two or more electrodes.

4 Claims, 15 Drawing Sheets

FOREIGN PATENT DOCUMENTS

| | | |
|---|---|---|
| JP | 9-157329 A | 6/1997 |
| JP | 2004-051684 A | 2/2004 |
| WO | 03/072615 A1 | 9/2003 |
| WO | 2009/090852 A1 | 7/2009 |

OTHER PUBLICATIONS

Minoru Isomura et al., "Synthesis of an Amphiphilic Conjugated Polymer Through Block Copolymerization of Phenylacetylene and (p-Tritytoxycarbonytphenyl)acetylene and the Subsequent Hydrolysis," Polymer Bulletin 46, 291-297 (2001).

Yasuhisa Kishimoto et al., "Living Polymerization of Phenylacetylenes Initiated by Rh(C≡CC6H5)(2,5-norbornadiene)[P(C6H5)3]2," J. Am. Chem. Soc. 116, 12131-12132 (1994).

E. Iwawaki et al., "Synthesis of Block Copolymers Containing 1-chloro-2-phenylacetylene, 2-nonyne, and (p-n-butyl-o,o,m,m-tetrafluorophenyl)acetylene Through Sequential Living Polymerization by MoOCl4-Based Catalysts," Polymer 42, 4055-4061 (2001).

Masayoshi Tabata et al., "Polymerization of m-Chlorophenylacetylene Initiated by [Rh(norbornadiene)Cl]2-Triethylamine Catalyst Containing Long-Lived Propagation Species," Polym. J., 22(12), 1105-1107 (1990).

Extended European Search Report in Application No. 08828688.5 (Dec. 29, 2010).

BLOCK POLYMER AND DEVICE

CROSS-REFERENCE TO RELATED APPLICATIONS

This application is a division of application Ser. No. 12/390,783, filed Feb. 23, 2009, which is a continuation of International Application No. PCT/JP2008/066011, filed Aug. 29, 2008, which claims the benefit of Japanese Patent Application No. 2007-227020, filed Aug. 31, 2007, and Japanese Patent Application No. 2008-212169, filed Aug. 20, 2008.

BACKGROUND OF THE INVENTION

1. Field of the Invention

The present invention relates to a block polymer having a coating insulating portion and a conductive portion in its molecules, and a device using the polymer.

2. Description of the Related Art

Attention has been currently attracted to organic devices each using a conductive organic substance such as an organic semiconductor in association with the advance of the integration of electronic circuits. The organic devices have the following merits: the device can be bent, and, if a process for the production of the device from a solution becomes feasible, the device can be produced at a low cost, and is applicable to a process for the production of a large-area device. Examples of the organic semiconductor include low-molecular weight organic semiconductors such as pentacene, and polymeric semiconductors such as polythiophene. The polymeric semiconductors have been regarded as attractive conductive materials for the large-area process and the low-cost process because the devices have particularly good affinity for the solution process.

Although organic polymers are generally in the shape of a thread ball, a n-conjugated polymer such as a substituted polyacetylene, polydiacetylene, or polyphenylene ethynylene has generally a linear molecule. In addition, even a nonlinear polymer is not in the shape of a thread ball but in a shape close to an extended chain depending on its crystal structure or orientation state. Such a linear molecule, in particular, the n-conjugated polymer can be expected to function as a monomolecular electronic device in principle by joining both of its terminals to electrodes. The introduction of an alkyl chain as a side chain of the repeating structure of such a linear molecule suppresses the movement of carriers between the molecule and an adjacent molecule, so the carriers move linearly along the axis of the molecule. As a result, the distance along which the carriers move is equal to or shorter than the length of the molecule, so the device can operate at a high speed. In an ordinary organic device, carriers move according to a movement mode in which the carriers move along a molecular axis or a movement mode in which the carriers hops between adjacent molecules, and the movement according to the hopping movement mode becomes rate-determining. Accordingly, high-speed movement of the carriers can be realized by introducing an alkyl chain into the side chain to eliminate the intermolecular hopping movement mode. In addition, the introduction of an alkyl chain into the side chain has an improving effect on the solubility of the polymer.

In this case, the following problem is raised in the injection of carriers into an organic molecule. Since the conjugated polymer is surrounded by alkyl chains, the conjugate structure and each of the electrodes are insulated from each other. Accordingly, the injection of carriers into the conjugate structure is restricted even when the molecules are placed on the electrodes. Therefore, a technique for injecting a carrier into a conjugated polymer surrounded by alkyl chains is needed.

In addition, existing organic devices realize some degree of electrical junction based on physical contact established by depositing a metal onto organic molecules so that the metal serves as an electrode or by forming the organic molecules into a film on an electrode. However, the electrical junction at an interface between the molecule and the electrode has been regarded as a serious problem inherent in the organic devices.

In view of the foregoing, a technique for bonding a conjugated polymer and an electrode more strongly to suppress an influence of an interface between the polymer and the electrode on electrical junction has been needed.

A system utilizing a gold-thiol bond has been reported as a technique for bonding an organic molecule and an electrode. For example, Japanese Patent Application Laid-Open No. H06-163049 describes the application of a polymer with a thiol introduced into its side chains to an organic cell using in its electrode a conductive material obtained by introducing a thiol into a side chain of an acrylic polymer or methacrylic polymer.

SUMMARY OF THE INVENTION

However, in such a system using a specific bond or affinity as described in Japanese Patent Application Laid-Open No. H06-163049, a material for an electrode is limited to result in an obstacle upon advancing the optimization of an entire device using the electrode. Accordingly, electrical junction between an electrode and an organic molecule by a system having no preference for a certain electrode material should be realized.

An external electric field must be applied to the main chain of a polymer as a path along which carriers move in order that the polymer may be caused to operate as a field-effect transistor as an important application of a monomolecular electronic device. Strictly speaking, it is preferable that no electric field is applied to an electrode portion and an electric field is applied only to the path along which carrier move, but no device having such a characteristic has been reported yet.

In addition, not only a wire but also a branched device is needed for the formation of a complex arithmetic circuit in a molecular device, but no such a device has been reported yet.

The present invention has been made in view of such background art, and provides a block polymer having an insulating coating portion and a conductive portion in its molecule, and capable of being used as a molecular wire that facilitates the injection of carriers between itself and an electrode.

The above-mentioned block polymer can be electrically joined to an electrode. Thus, the present invention provides a device in which multiple electrodes which pair up with each other through the chain of the polymer are placed, and the electrodes are bridged by one molecule.

A block polymer for solving the above-mentioned problems includes a coating insulating block and a conductive block and has a main chain composed of polyacetylene having a spiral structure, wherein the coating insulating block is formed of a block having a polyacetylene unit structure having alkyl chains at its side chains through functional groups, the alkyl chains being arranged in a direction parallel to the major axis of the main chain, and the conductive block is formed of a block having a polyacetylene unit structure having hydrogen atoms at its side chains through functional groups, the hydrogen atoms being arranged in a direction parallel to the major axis of the main chain.

In addition, a block polymer for solving the above-mentioned problems includes a coating insulating block and a conductive block and has a main chain composed of a spiral polymer, wherein the coating insulating block is formed of a block having a spiral polymer structure having alkyl chains at its side chains through functional groups, the alkyl chains being arranged in a direction parallel to the major axis of the main chain, and the conductive block is formed of a block having a spiral polymer structure having hydrogen atoms at its side chains through functional groups, the hydrogen atoms being arranged in a direction parallel to the major axis of the main chain.

A block polymer for solving the above-mentioned problems has a spiral structure and includes a coating insulating block and a conductive block.

A device for solving the above-mentioned problems includes the above-mentioned block polymer and two or more electrodes.

According to the present invention, a block polymer can be provided which has an insulating coating portion and a conductive portion in its molecule and can be used as a molecular wire that facilitates the injection of carriers between itself and an electrode.

In addition, the block polymer provided by the present invention has an insulating coating transporting portion and a conductive portion in its molecule, and can be used as a molecular wire that facilitates the injection of carriers between itself and an electrode.

The block polymer provided by the present invention has an insulating coating transport portion and a conductive portion in its molecule, and can transfer carriers injected from an electrode to a different electrode through a molecular wire, and so, can be used as a material for a molecular device.

The block polymer provided by the present invention can be utilized as a molecular device in which a current can be easily controlled because the polymer has an insulating-conductive coating layer block, and an electric field can be selectively applied to a conductive core portion as a path along which carriers move by applying an electric field from an external electrode coming in contact with the block.

In addition, the above-mentioned block polymer can be electrically joined to an electrode, and so, according to the present invention, a device can be provided in which multiple electrodes which pair up with each other through the chain of the polymer are placed, and the electrodes are bridged by one molecule.

In a device using the block polymer provided by the present invention, portions where one molecule is connected to a source electrode, a drain electrode and a gate electrode can be separated from one another, and an improvement in efficiency of electric field carrier induction can be expected from the modulation of the intensity of an electric field from the gate electrode. Such a molecule can be used as a molecular device of a nanometer size or as a novel one-dimensional molecular device by imparting a function as an electric-field-induced transistor to a one-dimensional molecular device.

The block polymer provided by the present invention has a conductive block sandwiched between insulating coating layer blocks, and can be formed into a three-terminal circuit by producing a device formed of: an external electrode in contact with the block; and two independent electrodes in contact with different blocks in the molecule.

Such a device can be applied to an arithmetic circuit by using a current response to the application of a voltage to an electrode of the device, and hence a one-dimensional molecular device can be used as a novel molecular device of a nanometer size as an arithmetic circuit.

Further features of the present invention will become apparent from the following description of exemplary embodiments with reference to the attached drawings.

DESCRIPTION OF THE EMBODIMENTS

Figure 1A:
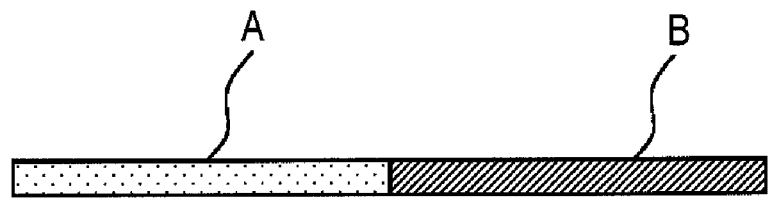
FIGS. 1A, 1B, and 1C are each a conceptual view showing an embodiment of a block polymer of the present invention.

Preferred embodiments of the present invention will now be described in detail in accordance with the accompanying drawings.

A block polymer according to the present invention includes a coating insulating block and a conductive block and has a main chain composed of polyacetylene having a spiral structure, wherein the coating insulating block is formed of a block having a polyacetylene unit structure having alkyl chains at its side chains through functional groups, the alkyl chains being arranged in a direction parallel to the major axis of the main chain, and the conductive block is formed of a block having a polyacetylene unit structure having hydrogen atoms at its side chain through functional groups, the hydrogen atoms being arranged in a direction parallel to the major axis of the main chain.

In addition, the block polymer according to the present invention includes a coating insulating block and a conductive block and has a main chain composed of a spiral polymer, wherein the coating insulating block is formed of a block having a spiral polymer structure having alkyl chains at its side chain through functional groups, the alkyl chains being arranged in a direction parallel to the major axis of the main chain, and the conductive block is formed of a block having a spiral polymer structure having hydrogen atoms at its side chains through functional groups, the hydrogen atoms being arranged in a direction parallel to the major axis of the main chain.

In addition, the block polymer according to the present invention is characterized in that it is a block polymer which has a coating insulating block and a conductive block, and includes a spiral structure.

In addition, a device according to the present invention is characterized in that it includes the above-mentioned block polymer and two or more electrodes.

The block polymer of the present invention is formed of a block polymer which includes a coating insulating block and a conductive block and whose main chain is composed of polyacetylene (hereinafter referred to as "block polyacetylene").

The coating insulating block is formed of a block having a polyacetylene unit structure having alkyl chains at its side chains through functional groups, the alkyl chains being arranged in a direction parallel to the major axis of the main chain.

The conductive block is formed of a block having a polyacetylene unit structure having hydrogen atoms at its side chains through functional groups, the hydrogen atoms being arranged in a direction parallel to the major axis of the main chain.

The above-mentioned block polyacetylene is obtained by continuously polymerizing an acetylene monomer constituting the coating insulating block and a monomer constituting the conductive block by the use of a transition metal complex made from, for example, rhodium in an organic solvent. The resultant polymer has a stereo-regular structure, and a polyacetylene chain as its main chain has a spiral structure.

In the present invention, a stereo-regular polymer in which a substituted acetylene is polymerized by using a metal complex and a polyacetylene main chain forms a spiral structure is defined as a spiral substituted polyacetylene, and a block polymer of the polyacetylene is defined as a spiral substituted polyblock acetylene.

The block polymer is applicable to a novel organic electronic device having a coating insulating block and a conductive block in various forms because the polymer shows solubility in an organic solvent. The device has such an advantage that a site having the coating insulating layer of the coating insulating block is bonded to the conductive block that facilitates the injection of electrons or holes between itself and an external electrode by the covalent bond of the main chain in one molecule, so that no interface is present, and electrons or holes can be efficiently injected into the coating insulating block.

Since injected carriers move preferentially in a polymer chain direction in a coating insulating block in which an insulative site such as an alkyl chain is introduced into the terminal of a side chain, the recombination of electrons and holes between molecules is suppressed.

Figure 1B:
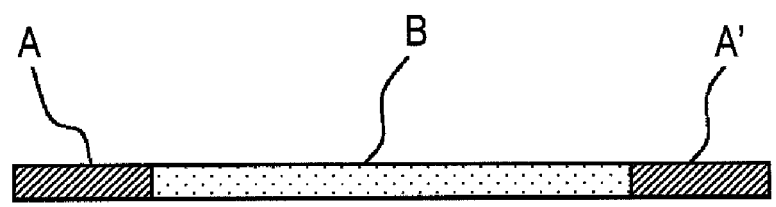
Figure 1C:
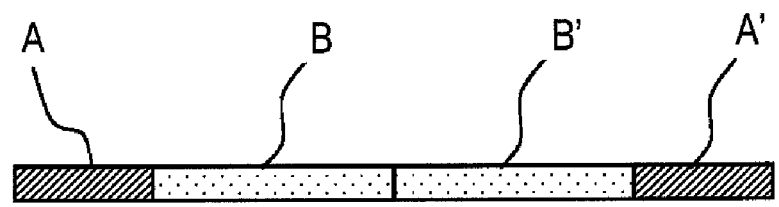

FIGS. 1A to 1C are each a conceptual view showing an embodiment of the block polymer of the present invention. In each of FIGS. 1A to 1C, A is a coating insulating block formed of a polyacetylene unit structure having alkyl chains at its side chains through functional groups, the alkyl chains being arranged in a direction parallel to the major axis of the main chain of the polymer, and B is a conductive block formed of a polyacetylene unit structure having hydrogen atoms at its side chains through functional groups, the hydrogen atoms being arranged in a direction parallel to the major axis of the main chain. The manner in which the coating insulating block A and the conductive block B are combined is not particularly limited as long as each molecule of the polymer contains the blocks; for example, as shown in FIG. 1A, A and B may be simply bonded to each other, or as shown in FIG. 1B, B may be sandwiched between A and A'.

Here, A' denotes a coating insulating block and may have a structure identical to, or different from, the structure of the block A. In addition, as shown in FIG. 1C, a structure formed of the blocks A and B may be connected to a structure formed of a block B' and the block A'. Here, B' denotes a conductive block different from B. The number of units of each of the coating insulating block A and the conductive block B is 10 or more, preferably 50 or more, and 10,000 or less.

Figure 2A:
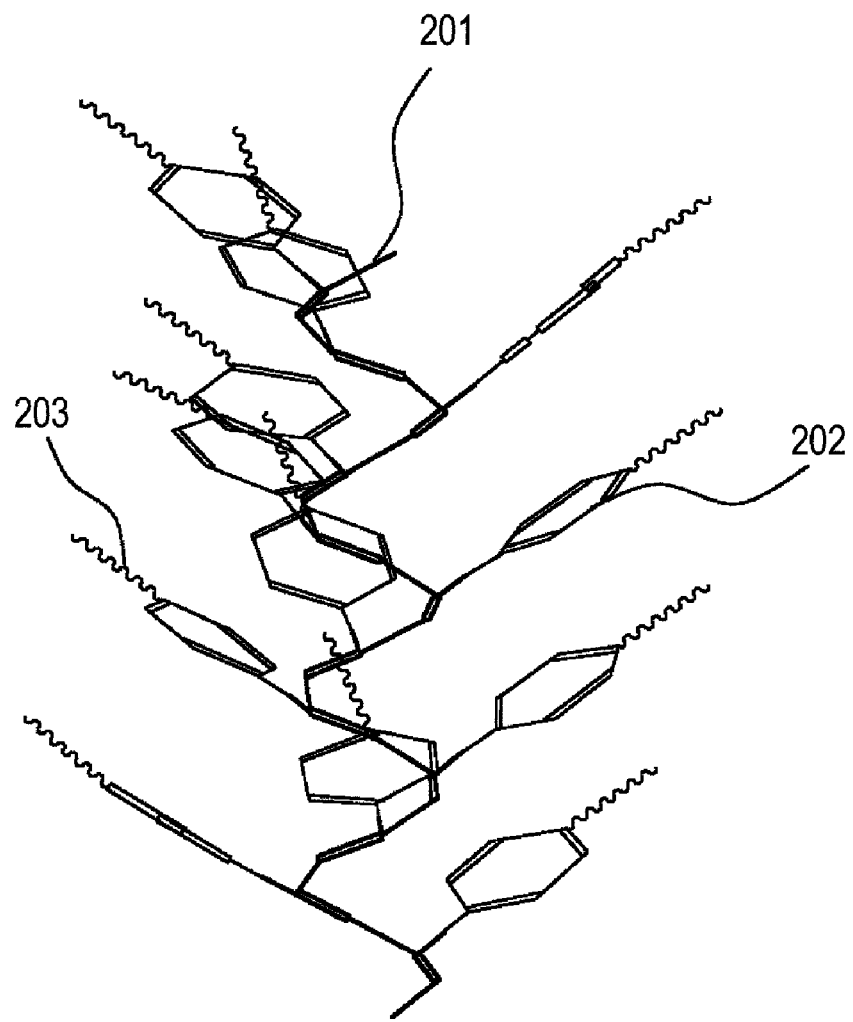
FIG. 2A is a schematic view showing the steric structure of a coating insulating block of the block polymer of the present invention.
Figure 2B:
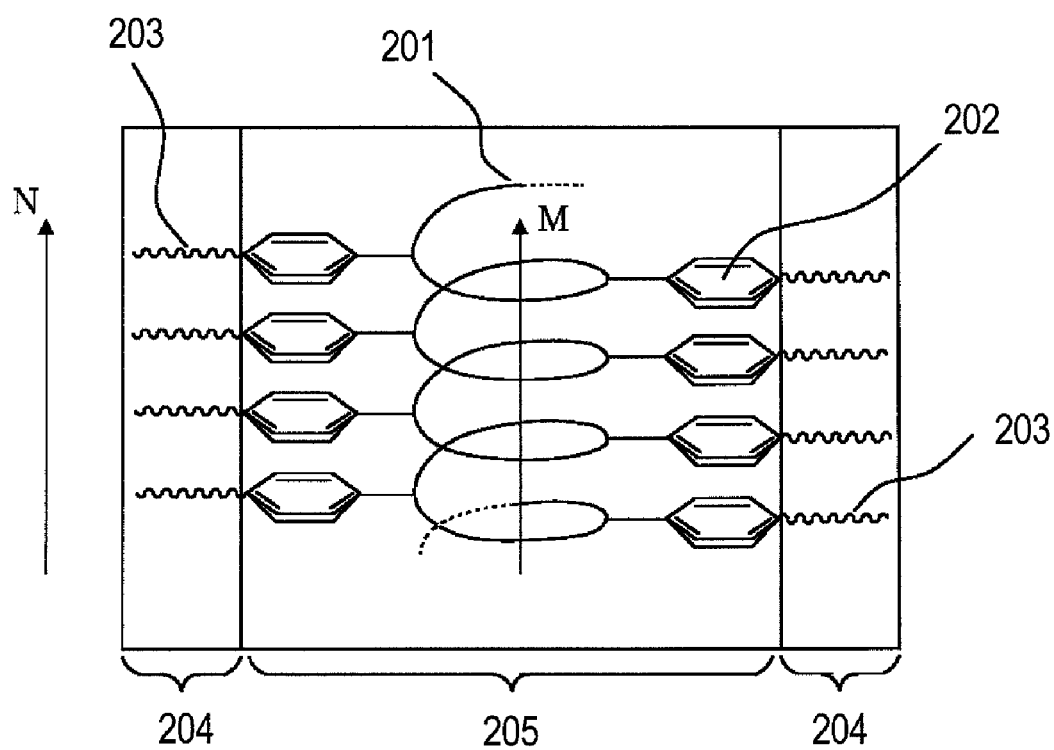
FIG. 2B is a schematic view showing the steric structure of the coating insulating block of the block polymer of the present invention.
Figure 2B:
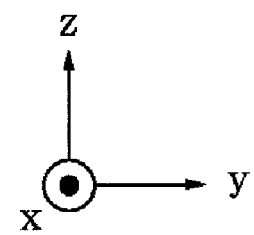
Figure 2C:
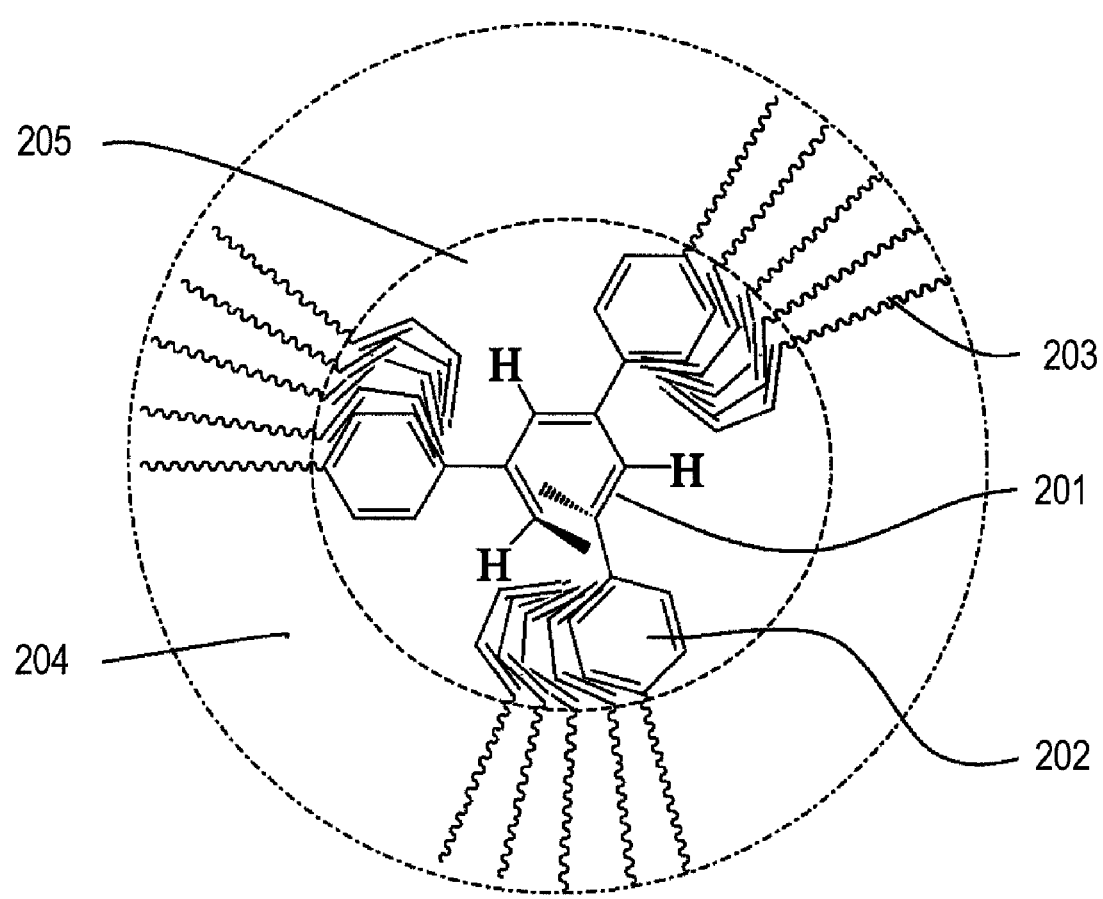
FIG. 2C is a schematic view showing the steric structure of the coating insulating block of the block polymer of the present invention.
Figure 2C:
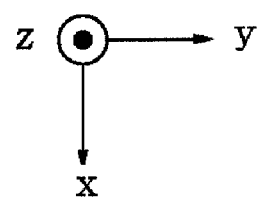

FIGS. 2A to 2C are each a schematic view showing the steric structure of the coating insulating block of the block polymer of the present invention. Although an aromatic phenyl group is used as each of the functional groups in each of FIGS. 2A to 2C, the present invention exerts the same effect irrespective of whether each of the functional groups is aromatic or non-aromatic.

In each of FIGS. 2A to 2C, the coating insulating block is formed of a block formed of a polyacetylene unit structure having alkyl chains 203 at its side chains through functional groups, the alkyl chains being arranged in a direction N parallel to a major axis M of a main chain 201.

The spiral, stereo-regular polyacetylene main chain 201 is substituted with functional groups 202 such as a phenyl group and a carboxyl group. Further, the alkyl chains 203 are present as substituents outside the functional groups. In such a structure, a core portion 205 of the spiral structure shown in FIG. 2B has conductivity because the polyacetylene main chain 201 and the functional groups 202 each have conductivity. However, a coating portion 204 of the spiral structure is insulative because the alkyl chains 203 positioned outside the core portion are each insulative. As a result, carriers injected into the coating insulating block do not move in the y direction, but move only in the z direction. FIG. 2C shows a schematic view perpendicular to the spiral direction z. As shown in the figure, the exchange of carriers between molecular chains is extremely difficult because the conductive core portion 205 is surrounded by the insulative coating portion 204. As a result, the carriers injected into the insulating coating insulating block move preferentially in the z direction.

Figure 3A:
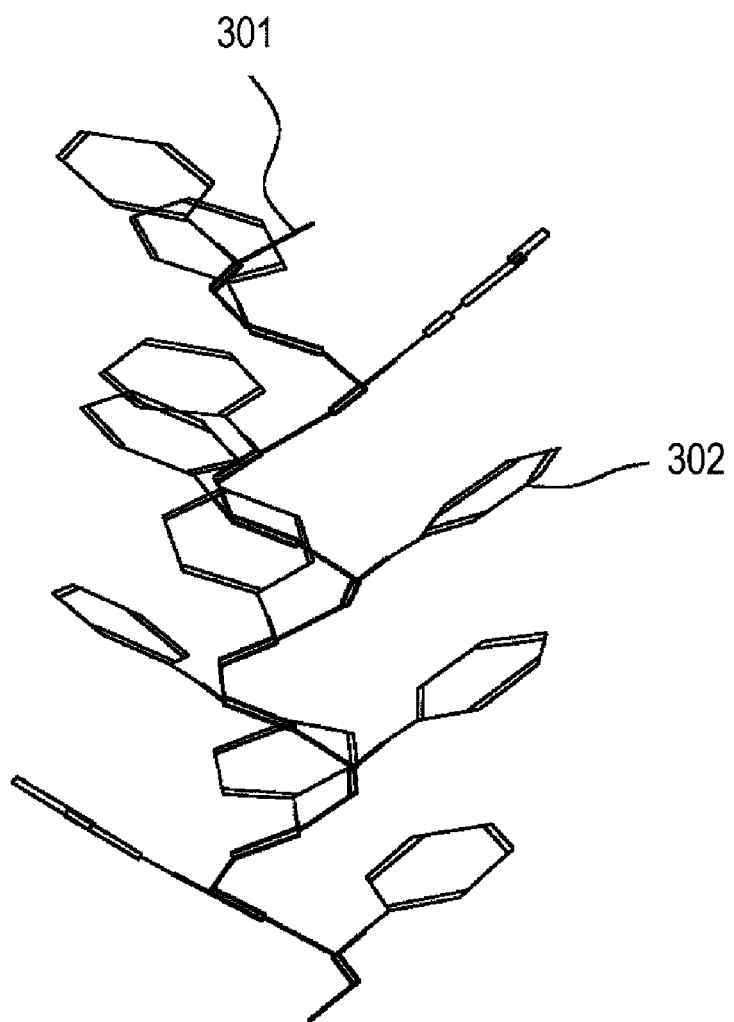
FIG. 3A is a schematic view showing the steric structure of a conductive block of the block polymer of the present invention.
Figure 3A:
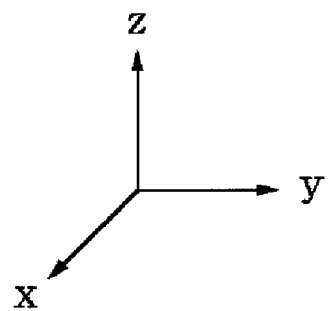
Figure 3B:
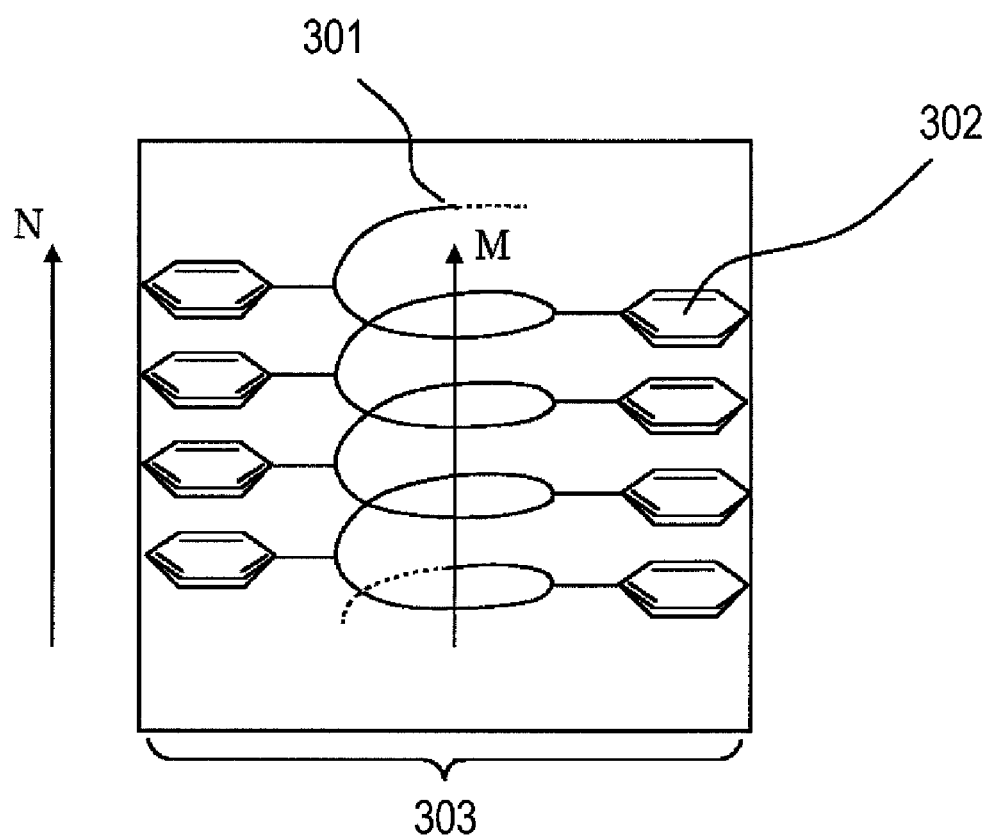
FIG. 3B is a schematic view showing the steric structure of the conductive block of the block polymer of the present invention.
Figure 3C:
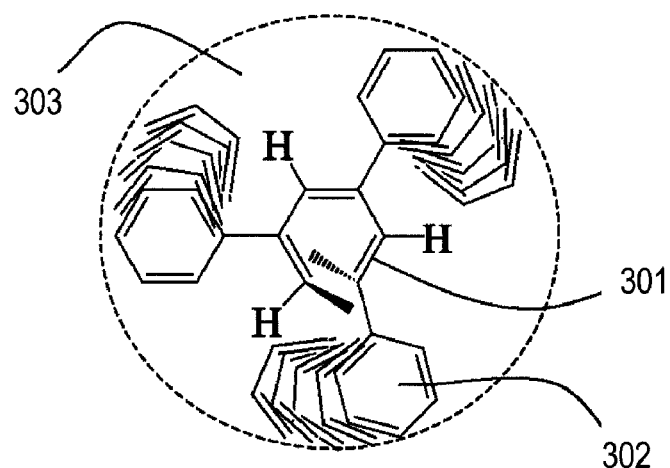
FIG. 3C is a schematic view showing the steric structure of the conductive block of the block polymer of the present invention.
Figure 3C:
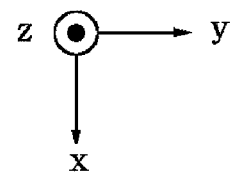

FIGS. 3A to 3C are each a schematic view showing the steric structure of the conductive block of the block polymer of the present invention.

In each of FIGS. 3A to 3C, the conductive block is formed of a block formed of a polyacetylene unit structure having hydrogen atoms at its side chains through functional groups, the hydrogen atoms being arranged in a direction N parallel to a major axis M of a main chain 301.

In each of FIGS. 3A to 3C, a spiral, stereo-regular polyacetylene main chain 301 is substituted with functional groups 302 such as a phenyl group and a carboxyl group, and hydrogen atoms are present as substituents outside the functional groups. In such a structure, the polyacetylene main chain 301 and the functional groups 302 each have conductivity, so the spiral structure, which is formed only of a core portion 303 as shown in FIG. 3B, has conductivity, and a carrier can be easily exchanged by contact with the conductive material. As a result, when an electrode is brought into contact with a conductive block and an electric field is applied, carriers are injected to move in the spiral structure portion. FIG. 3C shows a schematic view perpendicular to a spiral direction z. As shown in the figure, the exchange of carriers between molecular chains is easy because the polyacetylene structure is formed only of the conductive core portion 303. As a result, when the conductive block and the insulating coating insulating block are connected to each other, carriers injected into the conductive block easily move toward the coating insulating block.

The side chains of the coating insulating block are not particularly limited as long as the block is a polymer of a substituted acetylene substituted with a substituent so that at least one alkyl chain is placed in a direction parallel to the major axis of the polyacetylene main chain. FIGS. 2A to 2C each show the steric structure of a spiral, substituted polyacetylene. For example, when the substituent is a phenyl group as in a general formula (1), at least one of the substituents $X_2$, $X_3$, and $X_4$ each facing toward a direction coming off the polyacetylene main chain through the phenyl group has only to be a functional group containing an alkyl chain.

An essential condition for each of the coating insulating side chains of the coating insulating block is as follows: the side chain has an insulative alkyl chain between the outermost shell and main chain of the polymer. The block may be formed of an aromatic acetylene in which the functional group is a phenyl group, or may be formed of a non-aromatic acetylene in which the functional group is a propiolic acid ester.

Hereinafter, specific examples of the coating insulating block is described.

The coating insulating block is preferably a block formed of a unit structure of a polymer of substituted phenylacetylene represented by the following general formula (1):

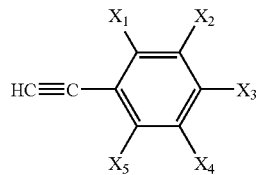

(1)

where $X_1$ and $X_5$ each represent a substituent having an alkyl chain having 1 or 2 carbon atoms, or a hydrogen atom, $X_2$, $X_3$, and each represent a substituent having an alkyl chain, a hydrogen atom, or a halogen atom, and at least one of $X_2$, $X_3$, and $X_4$ represents a substituent having an alkyl chain having 1 to 20 carbon atoms.

The coating insulating block is preferably a block formed of a unit structure of a polymer of substituted naphthylacetylene represented by the following general formula (2A) or (2B):

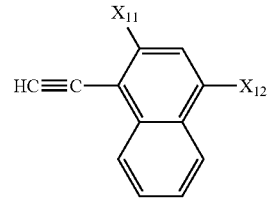

(2A)

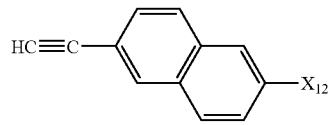

(2B)

where $X_{11}$ represents a substituent having an alkyl chain having 1 or 2 carbon atoms, or a hydrogen atom, and $X_{12}$ represents a substituent having an alkyl chain having 1 to 20 carbon atoms.

The coating insulating block is preferably a block formed of a unit structure of a polymer of substituted thienylacetylene represented by the following general formula (3A) or (3B):

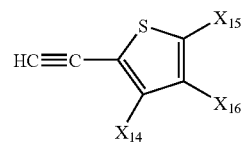

(3A)

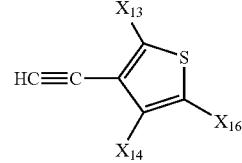

(3B)

where $X_{13}$ and $X_{14}$ each represent a substituent having an alkyl chain having 1 or 2 carbon atoms, or a hydrogen atom, $X_{15}$ and $X_{16}$ each represent a substituent having an alkyl chain, a hydrogen atom, or a halogen atom, and at least one of $X_{15}$ and $X_{16}$ represents a substituent having an alkyl chain having 1 to 20 carbon atoms.

The coating insulating block is preferably a block formed of a unit structure of a polymer of substituted ethynylcarbazole represented by the following general formula (4):

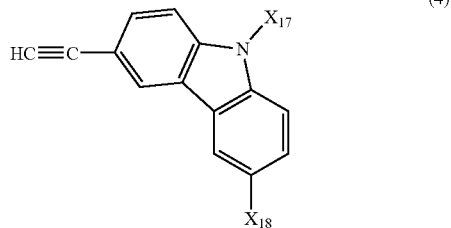

(4)

where $X_{17}$ and $X_{18}$ each represent a substituent having an alkyl, a hydrogen atom, or a halogen atom, and at least one of $X_{17}$ and $X_{18}$ represents a substituent having an alkyl chain having 1 to 20 carbon atoms.

The coating insulating block is preferably a block formed of a unit structure of a polymer of substituted ethynylfluorene represented by the following general formula (5):

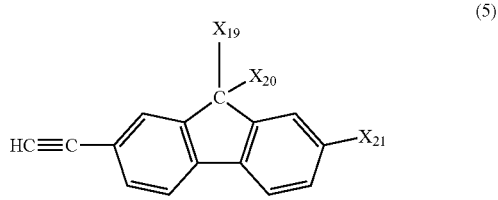

(5)

where $X_{19}$ and $X_{20}$ each represent a substituent having an alkyl chain having 1 or 2 carbon atoms, or a hydrogen atom, and $X_{21}$ represents a substituent having an alkyl chain having 1 to 20 carbon atoms.

The coating insulating block is preferably a block formed of a unit structure of a polymer of substituted propargylamide represented by the following general formula (6):

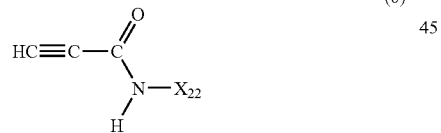

(6)

where $X_{22}$ represents a substituent having an alkyl chain having 1 to 20 carbon atoms.

In the above-mentioned general formulae (1) to (6), specific examples of the substituents include substituents having an alkyl chain such as an alkyl group, an alkoxy group, a thioether group, an ester group, a thioester group, a sulfoxide group, an amino group, an amido group, and an acetyl group.

Examples of the coating insulating side chains include 4-alkylphenylacetylene, 3-alkylphenylacetylene, 4-alkoxyphenylacetylene, alkylpropiolate, alkylpropargylamide, N-alkyl-4-ethynylbenzoate, 4-alkyl-1-naphthylacetylene, 7-alkyloxy-2-naphthylacetylene, 3-alkyl-2-thienylacetylene, 4-alkyl-3-thienylacetylene, N-alkyl-3-ethynylcarbazole, N-alkyl-6-alkyl-3-ethynylcarbazole, N,N'-dialkyl-2-ethynylfluorene, and N,N'-dialkyl-7-alkyl-2-ethynylfluorene. Alkyl means an alkyl chain having 1 to 20 carbon atoms such as methyl or ethyl.

Next, the conductive block is described.

The conductive block is formed of a block composed of a polyacetylene unit structure having hydrogen atoms at its side chains through functional groups, the hydrogen atoms being arranged in the direction parallel to the major axis of the main chain of the polymer. The side chains of the conductive block are not particularly limited as long as they are substituted with hydrogen atoms so that the hydrogen atoms are arranged in the direction parallel to the major axis of the polyacetylene main chain.

For example, when the substituents are each a phenyl group as in the general formula (1), each of $X_2$, $X_3$, and $X_4$ facing toward a direction coming off the acetylene main chain through the phenyl group has only to be substituted with a hydrogen atom. In addition, in this case, when the substituents $X_1$ and $X_5$ each facing toward a direction approaching the acetylene main chain through the phenyl group are bulky, $X_1$ and $X_5$ affect the structure of the main chain, so each of $X_1$ and $X_5$ should be substituted with a hydrogen atom, or should be substituted with a functional group having an alkyl chain having 2 or less carbon atoms.

An essential condition for the conductive side chain is that the side chain has no insulative alkyl chain between the outermost shell and main chain of the polymer. The block may be formed of an aromatic acetylene in which the functional group is a phenyl group, or may be formed of a non-aromatic acetylene in which the functional group is a propiolic acid ester.

Hereinafter, specific examples of the conductive block is described.

The conductive block is preferably a block formed of a unit structure of a polymer of substituted phenylacetylene represented by the following general formula (7):

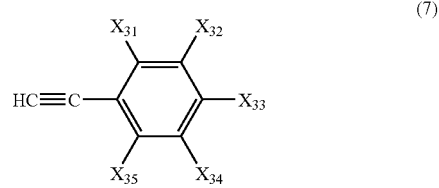

(7)

where $X_{32}$, $X_{33}$ and $X_{34}$ each represent a hydrogen atom or halogen, and $X_{31}$ and $X_{35}$ each represent a substituent having an alkyl chain having 1 to 4 carbon atoms, or a hydrogen atom.

The conductive block is preferably a block formed of a unit structure of a polymer of substituted thienylacetylene represented by the following general formulae (8A) and (8B):

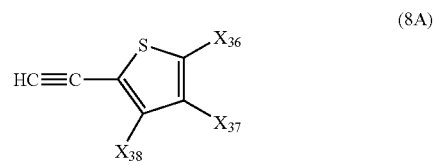

(8A)

-continued

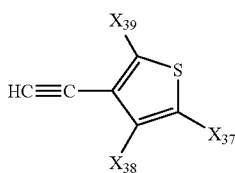
(8B)

where $X_{36}$ and $X_{37}$ each represent a hydrogen atom or halogen, and $X_{38}$ and $X_{39}$ each represent a substituent having an alkyl chain having 1 or 2 carbon atoms, or a hydrogen atom.

The conductive block is preferably a block formed of a unit structure of a polymer of substituted naphthylacetylene represented by the following general formulae (9A) and (9B):

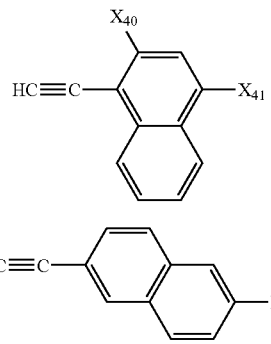
(9A)

(9B)

where $X_{41}$ represents a hydrogen atom or halogen, and $X_{40}$ represents a substituent having an alkyl chain having 1 or 2 carbon atoms, or a hydrogen atom.

The conductive block is preferably a block formed of a unit structure of a polymer of substituted ethynylcarbazole represented by the following general formula (10):

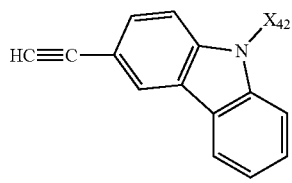
(10)

where $X_{42}$ represents a hydrogen atom or halogen.

The conductive block is preferably a block formed of a unit structure of a polymer of substituted ethynylfluorene represented by the following general formula (11):

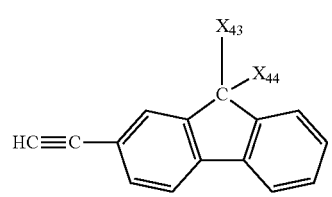
(11)

where $X_{43}$ and $X_{44}$ each represent a hydrogen atom or halogen.

Examples of the conductive side chains include phenylacetylene, 2-methoxyphenylacetylene, propiolic acid, 1-naphthylacetylene, 2-naphthylacetylene, 2-thienylacetylene, 3-thienylacetylene, 3-ethynylcarbazole, and 2-ethynylfluorene.

A method of producing the block polymer according to the present invention is not particularly limited; for example, the polymer can be produced by polymerizing a conductive substituted acetylene monomer by using a rhodium complex as a catalyst for the polymerization of a monosubstituted acetylene such as a rhodium (norbornadiene) chloride dimer, and adding an insulating coating substituted acetylene monomer to the resultant. A polar solvent such as dimethylformamide as well as a non-polar solvent such as chloroform, tetrahydrofuran or toluene can be used as a solvent for such polymerization. These solvents may be used singly or in a combination thereof.

In addition, a block polymer with its molecular weight controlled can be produced by using a three-way catalyst system composed of a rhodium complex, triphenylvinyl lithium, and triphenylphosphine as a catalyst system for the living polymerization of monosubstituted acetylene.

The above-mentioned conductive substituted acetylene monomer is phenylacetylene. The insulating coating substituted acetylene monomer is n-butyloxyphenylacetylene.

Next, a block polymer having a main chain formed of a spiral polymer structure is described.

Although the main chain skeleton of the block polymer of the present invention is a spiral structure made up of substituted polyacetylene, other spiral polymers exert a similar effect. Examples of the other spiral polymers include, for example, a conjugated polymer such as polysilane and a non-conjugated polymer such as polypeptide. In the case of the conjugated polymer, the main chain and conjugated side chains periodically arranged serve as a conducting path. In the case of the non-conjugated polymer, conjugated side chains directly bonded to the main chain and periodically arranged serve as a conducting path.

FIGS. 5A to 5D shows a conceptual view of the block polymer of the present invention.

A conductive core portion 501 is composed of a spiral polymer main chain 506 and conjugated sites 507 directly bonded to the polymer main chain, and an insulating coating layer 502 is composed of non-conjugated sites 508 each including an alkyl chain. The block polymer of the present invention is made up of a conductive block 503 composed only of the conductive core portion and a coating insulating block 504 having an insulating coating layer on the periphery of the conductive core portion. The block polymer may have multiple conductive blocks, and may have multiple coating insulating blocks.

The position of the conductive block is not particularly limited; the conductive block is desirably present at each of both terminals of the molecule. The length of each of the conductive block and the coating insulating block, which has only to be 10 units or more, is preferably 50 units or more and 10,000 units or less.

FIGS. 5A to 5D each show a block polymer having two conductive blocks, i.e., the conductive block 503 and a conductive block 505 on both sides of the coating insulating block 504.

Figure 5A:
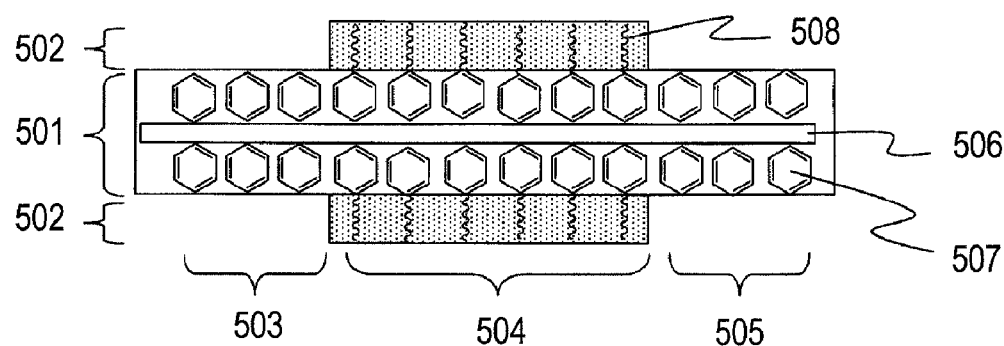
FIGS. 5A, 5B, 5C, and 5D are each an outline view showing another embodiment of the block polymer of the present invention.
Figure 5B:
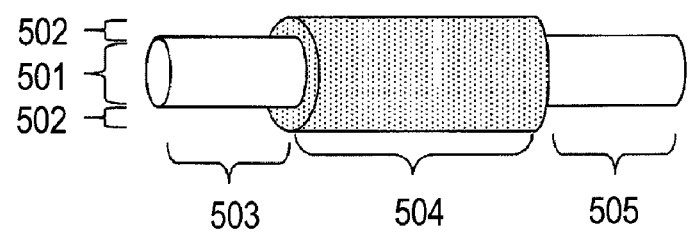
Figure 5C:
Figure 5D:
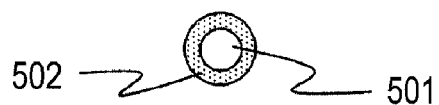

FIG. 5A is a schematic view of the molecular structure, and FIG. 5B is an image view of the molecular shape formed of a spiral structure. FIG. 5C is a schematic sectional view of the conductive block, and FIG. 5D is a schematic sectional view of the coating insulating block.

Figure 6A:
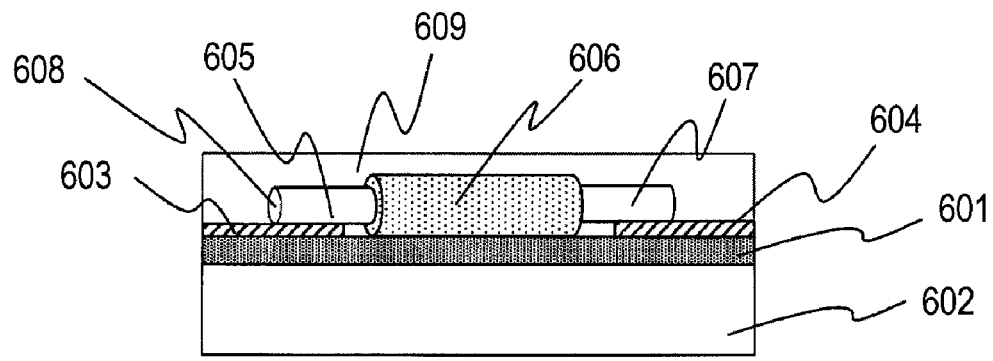
FIG. 6A is a schematic view of a device using the block polymer of the present invention viewed in the lateral direction of the substrate of the device.
Figure 6B:
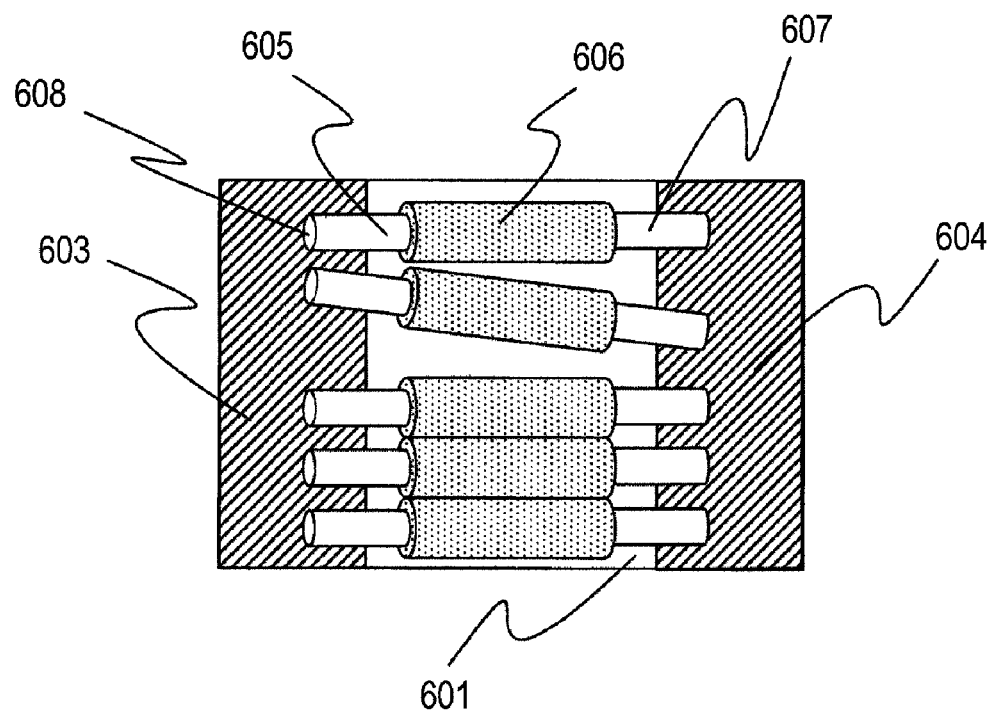
FIG. 6B is a schematic view of the device using the block polymer of the present invention viewed from above the substrate.

FIGS. 6A and 6B each show a schematic view of a device obtained by combining such a block polymer and an electrode substrate. FIG. 6A is a schematic view of the device viewed in the lateral direction of the substrate, and FIG. 6B is a schematic view of the device viewed from above the substrate.

When supposing a spiral polymer block polymer 608 placed on a conductive substrate 602 having an insulating film 601, in such a polymer as shown in FIG. 6A in which conductive blocks 605 and 607 are successively bonded to both sides of a coating insulating block 606, electrodes 603 and 604 independent of each other are placed so as to come in contact with both terminals of the conductive blocks 605 and 607. Carriers injected from the electrode 603 into the conductive block 605 move one-dimensionally through the conductive core portion by virtue of a difference in conductivity between the insulating coating layer and the core portion toward the electrode 604 through the conductive block 607 on the opposite side. The operating speed and efficiency of the device are improved by the straight movement of carriers characteristic of a one-dimensional conductive wire. Such one-dimensional conductive wire can be used in a device such as an FET by, for example, controlling the conductivity of the spiral polymer block polymer with the conductive substrate 602 as a gate electrode.

FIGS. 7A to 7D show a block polymer having three conductive blocks 703, 705, and 707 between, and on both sides of, two coating insulating blocks 704 and 706.

Figure 7A:
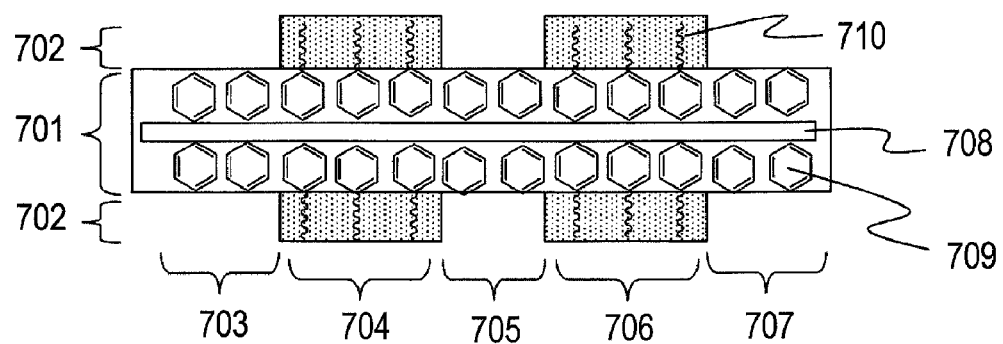
FIGS. 7A, 7B, 7C, and 7D are each a conceptual view showing another embodiment of the block polymer of the present invention.
Figure 7B:
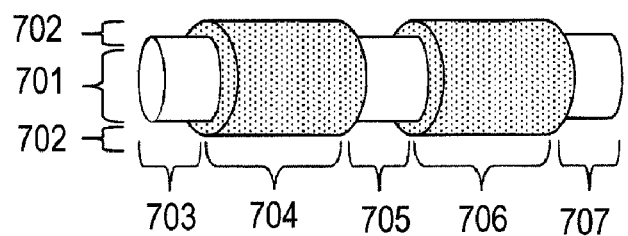
Figure 7C:
Figure 7D:
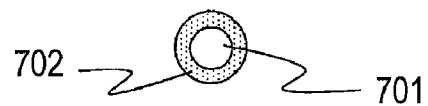

FIG. 7A is a schematic view of the molecular structure, and FIG. 7B is an imaginary view of the molecular shape formed of a spiral structure. FIG. 7C is a schematic sectional view of the conductive block, and FIG. 7D is a schematic sectional view of the coating insulating block. A conductive core portion 701 is formed of a spiral polymer main chain 708 and conjugated sites 709 directly bonded to the polymer main chain, and an insulating coating layer 702 is formed of non-conjugated sites 710 each including an alkyl chain. A block polymer having two coating insulating blocks and three conductive blocks has been described here; neither the number of conductive blocks nor the number of coating insulating blocks is particularly limited as long as at least one conductive block sandwiched between coating insulating blocks is present.

In addition, the length of each of the conductive blocks and the coating insulating blocks, which has only to be 10 units or more, is preferably 50 units or more and 10,000 units or less.

Figure 8A:
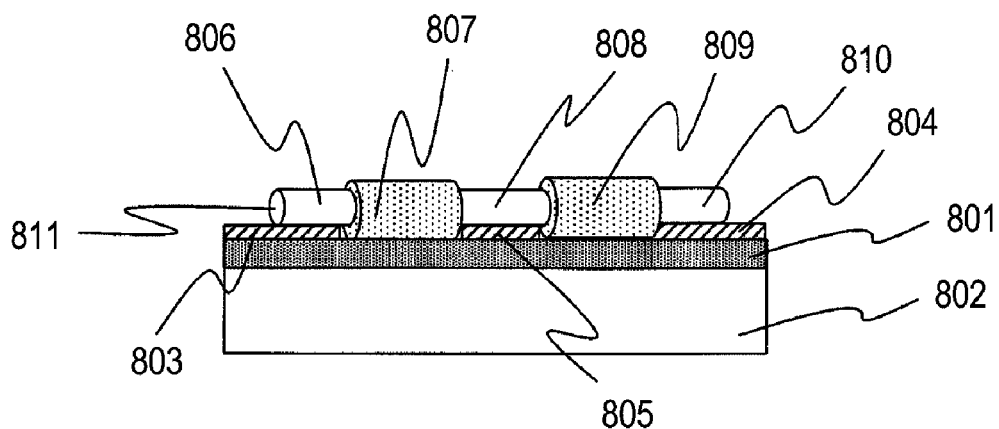
FIG. 8A is a schematic view of a device using the block polymer of the present invention viewed in the lateral direction of the substrate of the device.
Figure 8B:
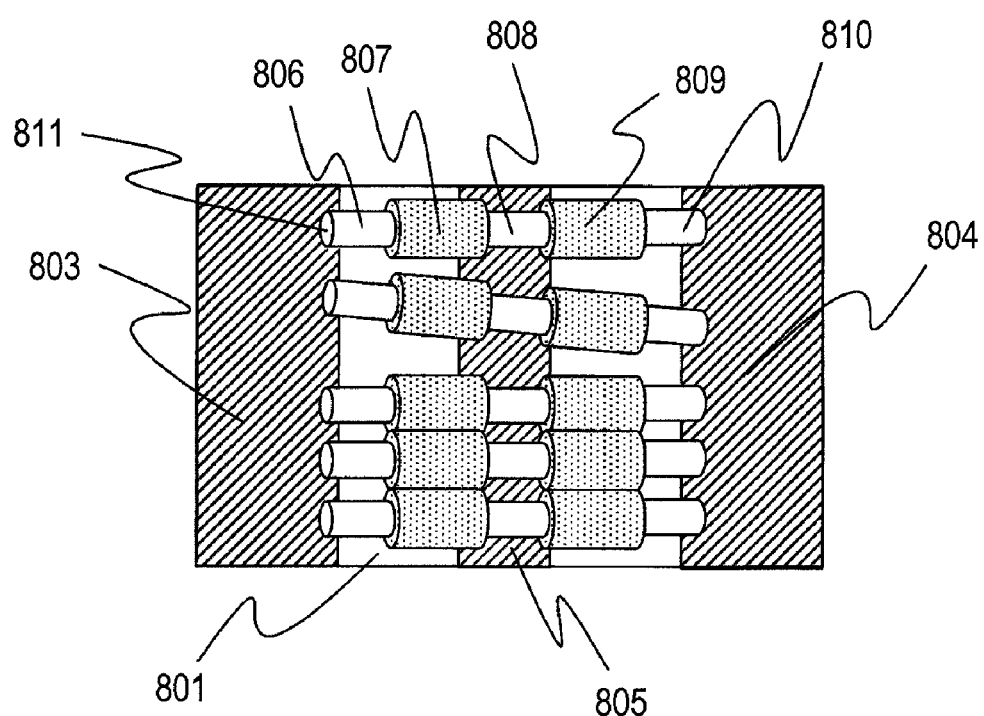
FIG. 8B is a schematic view of the device using the block polymer of the present invention viewed from above the substrate.

FIGS. 8A and 8B show a schematic view of a device obtained by combining the block polymer shown in FIGS. 7A to 7D and an electrode substrate. FIG. 8A is a schematic view of the device viewed in the lateral direction of the substrate, and FIG. 8B is a schematic view of the device viewed from above the substrate.

In a device obtained by placing, on a conductive substrate 802 having an insulating film 801, a block polymer 811 in which two coating insulating blocks 807 and 809 and three conductive blocks 806, 808, and 810 are successively bonded to one another, electrodes 803 and 804 independent of each other are placed so as to come in contact with both terminals of the conductive blocks 806 and 810, and an independent electrode 805 is placed so as to come in contact with the conductive blocks 808.

When a voltage is applied between the electrodes 803 and 804, carriers injected from the electrode 803 into the block 806 move one-dimensionally in a conductive core portion by virtue of a difference in conductivity between an insulating coating layer and the core portion toward the electrode 805 through the intermediate conductive block 808 to show a current response. When a voltage is applied between the electrodes 804 and 805, carriers injected from the electrode 804 into the block 810 also move one-dimensionally through the conductive core portion by virtue of a difference in conductivity between the insulating coating layer and the core portion toward the electrode 805 through the intermediate conductive block 808 to show a current response.

In addition, when a voltage is applied between the electrode 805 and each of the electrodes 803 and 804, carriers injected from the electrode 805 into the block 808 move one-dimensionally through the conductive core portion by virtue of a difference in conductivity between the insulating coating layer and the core portion and are distributed to the electrodes 803 and 804 through the intermediate conductive blocks 806 and 810 to show a current response. The device is applicable to an arithmetic circuit by using such a current response to the application of a voltage. Such a molecule can be used as a novel molecular device of a nanometer size by imparting a function as an arithmetic circuit to a one-dimensional molecular device.

Figure 9:
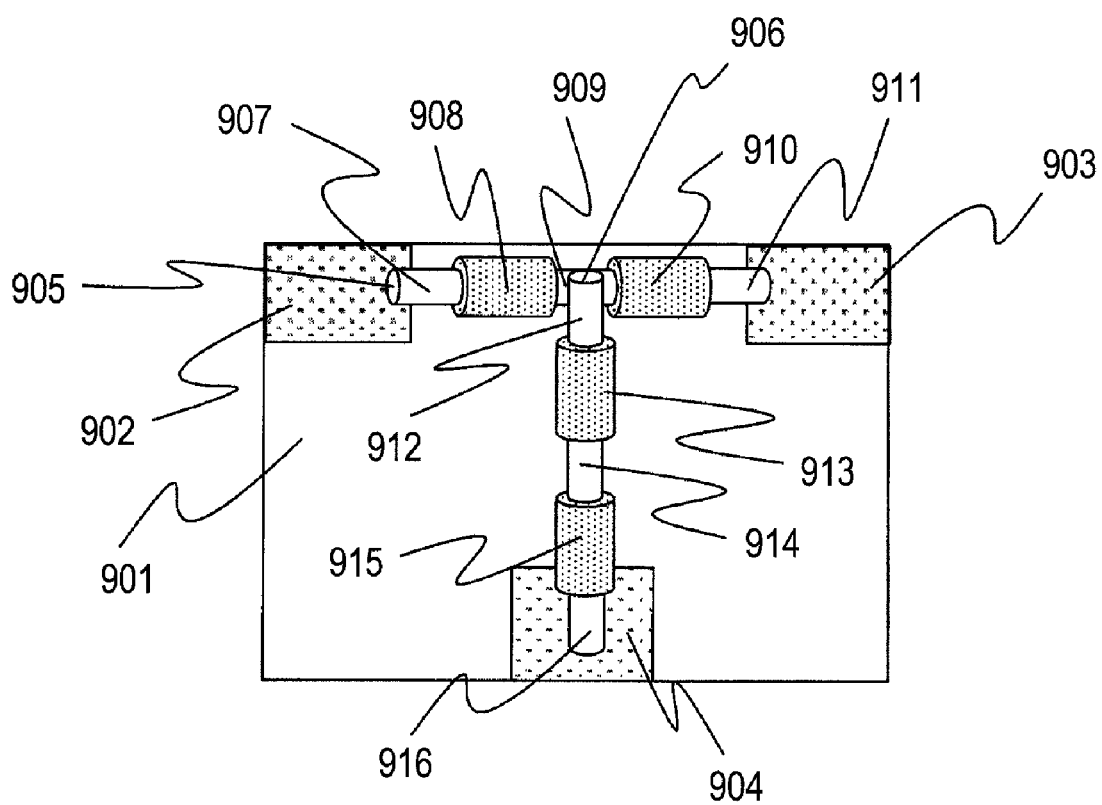
FIG. 9 is a schematic view of a device obtained by combining multiple block polymers shown in FIGS. 7A, 7B, 7C, and 7D, and an electrode substrate.

FIG. 9 shows a schematic view of a device obtained by combining two or more of the block polymer shown in FIGS. 7A to 7D, and an electrode substrate. FIG. 9 is a schematic view of the device viewed from above the substrate.

A device will be described in which two or more of a block polymer in which two coating insulating blocks 908 and 910 and three conductive blocks 907, 909, and 911 are successively bonded to one another are present on an insulating substrate 901. Here, the case where block polymers 905 and 906 are combined is described for simplicity. Here, the case where the intermediate conductive block 909 of the block polymer 905 is in contact with the terminal conductive block 912 of the different block polymer 906 is described.

Electrodes 902 and 903 independent of each other are placed so as to come in contact with both terminals of the conductive blocks 907 and 911. Carriers injected from the electrode 902 into the block 907 move one-dimensionally in a conductive core portion by virtue of a difference in conductivity between an insulating coating layer and the core portion toward the electrode 903 through the block 911 on the opposite side.

In this case, the conductive block 912 of the other block polymer 906 is in contact with the conductive block 909, so carriers injected from the electrode 902 move between the conductive blocks 909 and 912 so as to move toward the block polymer 906. Then, carriers move in a coating insulating block 913, conductive block 914 and coating insulating block 915 of the block polymer 906 toward an electrode 904 from the other terminal conductive block 916. Such a device can operate as a branched device that cannot have been conventionally achieved.

FIGS. 10A to 10D show an example of the block polymer of the present invention in which the block polymer shown in FIGS. 5A to 5D includes a spiral polymer block having coating insulating alkyl chains at its side chains and conductive conjugated sites outside the alkyl chains. In the present invention, a block formed of the repeating structure is defined as an insulating-conductive coating block. The length of the insulating-conductive coating block, which has only to be 10 units or more, is preferably 50 units or more and 10,000 units or less.

Figure 10A:
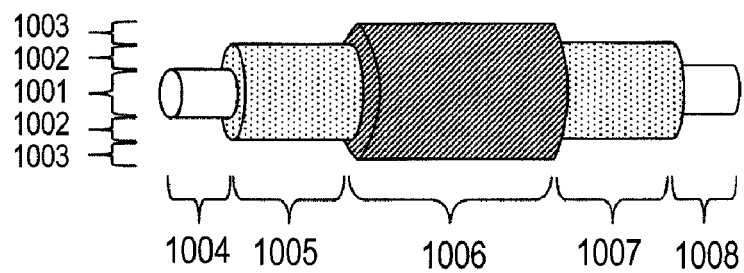
FIGS. 10A, 10B, 10C, and 10D are each a conceptual view showing another embodiment of the block polymer of the present invention.
Figure 10B:
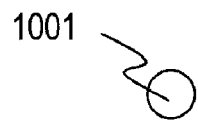
Figure 10C:
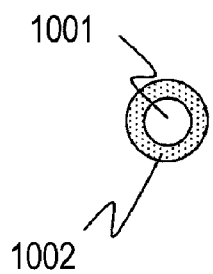
Figure 10D:
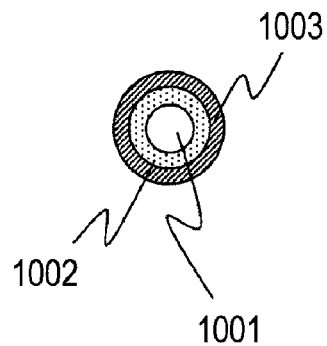

Since the block polymer is of such a structure that a spiral polymer chain 1001 of the main chain is surrounded by non-conjugated sites, the non-conjugated sites serve as an insulating coating layer 1002, and the conjugated sites further surround the layer to serve as a conductive coating layer 1003. An alkyl chain at a side chain of a spiral substituted polyacetylene as a representative example of a spiral polymer is known to extend toward the outside, so the thickness of the insulating coating layer 1002 can be controlled depending on the length of the alkyl chain. In addition, the conjugated sites outside the layer are also arranged at a nearly equal interval by virtue of the periodicity of the spiral structure of the main chain, so the conductive coating layer 1003 is expected to have higher conductivity than the insulating coating layer 1002 by virtue of a conduction mechanism through hopping between conjugated sites. FIG. 10A shows an example of a block polymer in which conductive blocks 1004 and 1008 formed only of the spiral polymer chain, insulating coating blocks 1005 and 1007 each having the insulating coating layer, and an insulating-conductive coating block 1006 having the conductive coating layer are successively bonded to one another.

In the steric structure of the block polymer, the coating insulating layer 1002 composed of a layer of the non-conjugated sites and the conductive coating layer 1003 composed of a layer of the conjugated sites that can be easily connected to an external electrode are covalently bonded to the spiral polymer chain 1001 of the main chain to make up a continuous three-layer structure in one molecule. Accordingly, the following advantage can be obtained: a constant electric field can be applied to the spiral polymer chain 1001 by applying an electric field to the outer conductive layer 1003, and carriers can be induced in the spiral polymer at a stable field intensity. The induced carriers have a suppressing effect on the recombination of electrons and holes between molecules or on the scattering of conduction carriers because the induced carriers move one-dimensionally through the conductive core portion of the spiral polymer into which the insulative non-conjugated sites have been introduced.

The conjugated sites are not particularly limited as long as each of them is an unsubstituted aromatic ring or heteroaromatic ring. An essential condition for the conjugated sites is that the outermost aromatic ring is not substituted with any insulative non-conjugated site, and the ring is desirably unsubstituted. Each of the conjugated sites may be a fused aromatic ring such as a phenyl ring, a naphthyl ring or an anthracene ring, may be a non-fused aromatic ring such as a fluorene ring, or may be a heteroaromatic ring such as a thiophene ring, a pyridine ring, a carbazole ring or an oxazole ring. To be more specific, examples of the conjugated sites include a phenyl group, a naphthyl group, a thienyl group, a carbazolyl group, and a fluorenyl group.

Figure 11A:
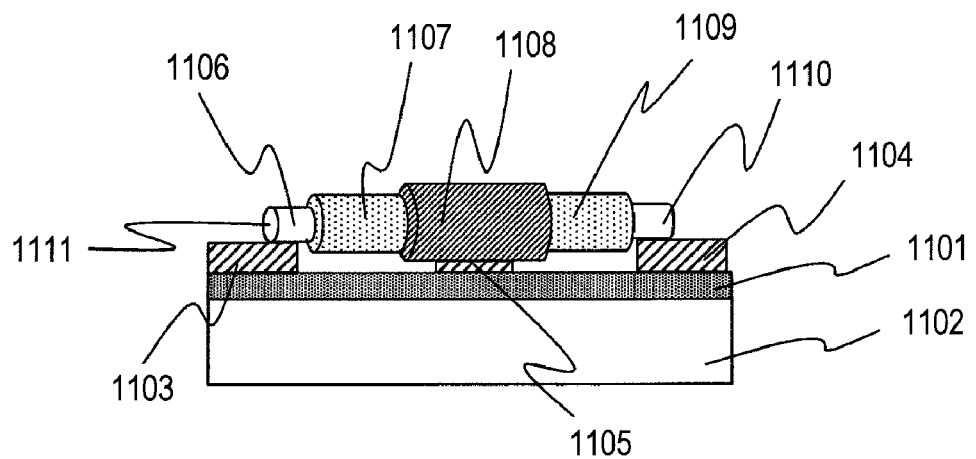
FIG. 11A is a schematic view of a device using the block polymer of the present invention viewed in the lateral direction of the substrate of the device.
Figure 11B:
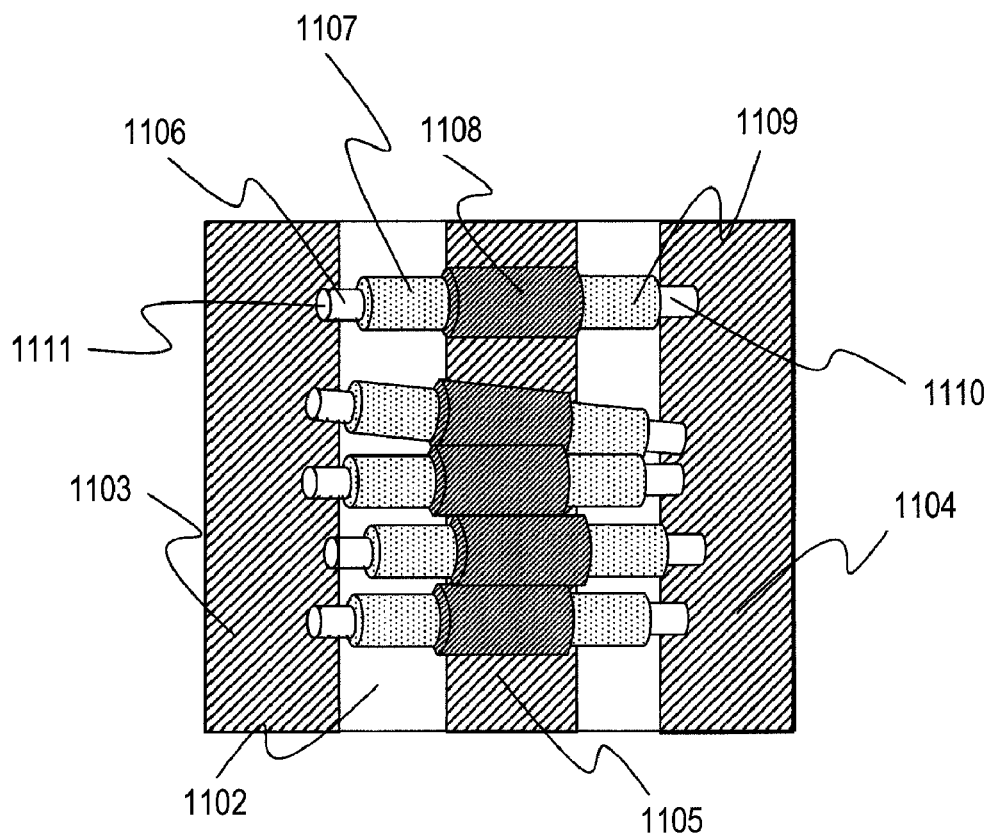
FIG. 11B is a schematic view of the device using the block polymer of the present invention viewed from above the substrate.

FIGS. 11A and 11B show a schematic view of a device obtained by combining the block polymer shown in FIGS. 10A to 10D and an electrode substrate. FIG. 11A is a schematic view of the device viewed in the lateral direction of the substrate, and FIG. 11B is a schematic view of the device viewed from above the substrate.

When supposing spiral polymer block polymers placed on a substrate 1102 having an insulating film 1101, in such a block polymer as shown in FIGS. 10A to 10D in which coating insulating blocks 1107 and 1109 are successively bonded to both sides of an insulating-conductive coating block 1108, and furthermore, conductive blocks 1106 and 1110 are successively bonded to both sides of the coating insulating blocks, electrodes 1103 and 1104 independent of each other are placed so as to come in contact with both terminals of the blocks 1106 and 1109, and an electrode 1105 is placed so as to come in contact with the block 1108. Carriers injected from the electrode 1103 into the block 1106 move one-dimensionally through a conductive core portion 1111 by virtue of a difference in conductivity between a non-conjugated site and the core portion toward the electrode 1104 through the block 1109 on the opposite side. In this case, when an electric field is applied to the electrode 1105, carriers are induced in the block 1108, whereby a current value between the electrodes 1103 and 1104 increases.

The block polymer of the present invention thus obtained can be utilized in a molecular wire. For example, a block polymer in which conductive blocks are connected to both sides of a coating insulating block is placed on an electrode pattern made of a metal or the like having a gap equal to or shorter than the molecular length of the coating insulating block so that the conductive blocks of at least part of the molecules are brought into contact with the upper portion of an electrode. Since the conductive blocks and the electrode are in contact with each other, carriers are injected from the electrode, move toward the insulating coating insulating block, pass through the insulating block, and move toward the conductive block on the opposite side. The exchange of the carriers which have moved toward the conductive block on the opposite side is performed between the conductive block and the electrode when the conductive block and the electrode are in contact with each other. When the conductive block and the electrode are not in contact with each other, the exchange of the carriers is performed between the conductive block and a conductive block of any other molecule near, or in contact with, the conductive block, whereby the carriers move toward the electrode through several molecules. As described above, irrespective of a monomolecular device, or a bulk- or membrane-like device, the connection between a conductive block and an insulating coating insulating block has an effect on the exchange of carriers between conductive blocks or between a conductive block and an electrode.

In a device using such a block polymer, portions connected to a source electrode, a drain electrode and a gate electrode can be separated from one another in one molecule, and an improvement in efficiency of electric field carrier induction in the molecule can be expected from the modulation of the intensity of an electric field from the gate electrode.

Such a molecule can be used as a molecular device of a nanometer size or as a novel one-dimensional molecular device where a function as a electric-field-induced transistor is imparted.

EXAMPLES

Hereinafter, a method of producing a substituted polyacetylene block polymer in the present invention, and a method of producing a device structure formed of the substituted polyacetylene block polymer and an electrode is described.

Example 1

The pressure in a test tube is reduced, the air in the test tube is replaced with nitrogen, and then the test tube is hermetically sealed. 29 mg of a rhodium (norbornadiene) chloride dimer, 100 mg of triethylamine and 17.5 ml of toluene are placed in the test tube, and the mixture is stirred at 30° C. for 30 minutes.

A mixed solution of 0.033 g of phenylacetylene and 2.0 ml of toluene is poured into a solution of the resultant rhodium complex in toluene, whereby a polymerization reaction is initiated. The reaction is performed at 30° C. for 1 hour. After the polymerization has sufficiently progressed, 0.202 g of 4-hexyloxyphenylacetylene is poured into the resultant, and a polymerization reaction is further performed. The reaction is performed at 30° C. for 2 hours, and the resultant polymer is washed with methanol and filtrated. After that, the polymer is dried for 24 hours in a vacuum, whereby poly((phenylacetylene)-co-(4-hexyloxyphenylacetylene)) as a target polyacetylene block polymer is obtained nearly quantitatively.

Example 2

The pressure in a test tube is reduced, the air in the test tube is replaced with nitrogen, and then the test tube is hermetically sealed. 29 mg of a rhodium (norbornadiene) chloride dimer and 15 ml of toluene are placed in the test tube, and the mixture is stirred at 0° C. for 15 minutes. After that, 2.5 ml of a 0.1 mol/l solution of 1,1,2-triphenylvinyllithium in toluene is poured into the resultant mixture, and then 2.5 ml of a solution of 100 mg of triphenylphosphine in toluene is poured into the resultant mixture, and the whole is stirred for 30 minutes.

A mixed solution of 0.033 g of phenylacetylene and 2.0 ml of toluene is poured into a solution of the rhodium complex obtained by the above-mentioned method in toluene, whereby a polymerization reaction is initiated. The reaction is performed at 30° C. for 30 minutes. After the polymerization has sufficiently progressed, 0.202 g of 4-hexyloxyphenylacetylene is poured into the resultant, and a polymerization reaction is further performed. After the polymerization has sufficiently progressed, 0.033 g of phenylacetylene is poured into the resultant, and a polymerization reaction is further performed. The reaction is performed at 30° C. for 1 hour, and the resultant polymer is washed with methanol and filtrated. After that, the polymer is dried for 24 hours in a vacuum, whereby poly((phenylacetylene)-co-(4-hexyloxyphenylacetylene)-co-(phenylacetylene)) as a target polyacetylene block polymer is obtained quantitatively.

Example 3

Example 3 is performed in the same manner as in Example 2, except that phenylacetylene is replaced with 3-thienylacetylene, and 4-hexyloxyphenylacetylene is replaced with 4-methyl-1-naphthylacetylene, whereby poly((3-thienylacetylene)-co-(4-methyl-1-naphthylacetylene)-co-(3-thienylacetylene)) as a polyacetylene block polymer is obtained quantitatively.

Example 4

Example 4 is performed in the same manner as in Example 2, except that phenylacetylene is replaced with 1-naphthylacetylene, and 4-hexyloxyphenylacetylene is replaced with 2-hexyl-3-thienylacetylene, whereby poly((1-naphthylacetylene)-co-(2-hexyl-3-thienylacetylene)-co-(1-naphthylacetylene)) as a polyacetylene block polymer is obtained quantitatively.

Example 5

Example 5 is performed in the same manner as in Example 2, except that phenylacetylene is replaced with 2-ethynylfluorene, and 4-hexyloxyphenylacetylene is replaced with N-2-ethylhexyl-3-ethynylcarbazole, whereby poly((2-ethynylfluorene)-co-(N-2-ethylhexyl-3-ethynylcarbazole)-co-(2-ethynylfluorene)) as a polyacetylene block polymer is obtained quantitatively.

Example 6

Example 6 is performed in the same manner as in Example 2, except that phenylacetylene is replaced with 3-ethynylcarbazole, and 4-hexyloxyphenylacetylene is replaced with N,N'-di(2-ethylhexyl)-2-ethynylfluorene, whereby poly((3-ethynylcarbazole)-co-(N,N'-di(2-ethylhexyl)-2-ethynylfluorene)-co-(3-ethynylcarbazole)) as a polyacetylene block polymer is obtained quantitatively.

Example 7

Example 7 is performed in the same manner as in Example 2, except that 4-hexyloxyphenylacetylene is replaced with N-t-butylpropargylamide, whereby poly((phenylacetylene)-co-(N-t-butylpropargylamide)-co-(3-ethynylcarbazole)) as a polyacetylene block polymer is obtained quantitatively.

Example 8

A method of producing a device structure is described.

Figure 4:
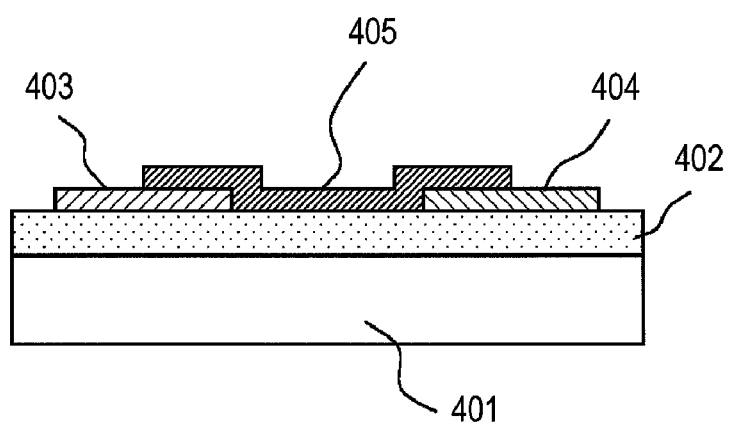
FIG. 4 is an outline view showing an embodiment of a device according to the present invention.

As shown in FIG. 4, the device according to this example is formed on a highly doped Si substrate 401 having a thermal oxidation film 402 having a thickness of 100 nm on its surface. Au electrodes 403 and 404 are formed by lithography employing electron beam exposure, and a distance between the electrodes is about 50 nm. A $1.0 \times 10^{-3}$ wt % solution is prepared by dissolving the polyacetylene block polymer obtained in Example 2 described above in 1.0 ml of chloroform, and is applied between the electrodes.

The solution is applied by a spin coating method onto the gold electrodes formed into a pattern on the silicon substrate, whereby a polyacetylene block polymer layer 405 is formed. The polyacetylene block polymer layer 405 to be used in this example has a length of about 100 nm, and a large number of molecules are brought into contact with both the electrodes 403 and 404, whereby intermolecular hopping conduction between the electrodes 403 and 404 is suppressed.

In this device, the Si substrate 401 operates as a gate electrode, and a current flowing between the electrodes 403 and 404 is controlled by the application of a voltage to the Si substrate 401.

Example 9

The pressure in a test tube is reduced, the air in the test tube is replaced with nitrogen, and then the test tube is hermetically sealed. 0.005 mmol of a rhodium (norbornadiene) chloride dimer and 1 ml of toluene are placed in the test tube, and the mixture is stirred at 0° C. for 15 minutes. After that, 0.2 ml of a 0.1 mol/l solution of 1,1,2-triphenylvinyllithium in toluene is poured into the resultant mixture, and the whole is stirred for 30 minutes. After that, 0.3 ml of a 0.1 mol/l solution of triphenylphosphine in toluene is poured into the resultant mixture, and the whole is stirred for an additional 30 minutes.

A mixed solution of 3 mmol of phenylacetylene and 1.5 ml of toluene is poured into a solution of the rhodium complex obtained by the above-mentioned method in toluene, whereby a polymerization reaction is initiated. The reaction is performed at 30° C. for 30 minutes. After the polymerization has sufficiently progressed, a mixed solution of 10 mmol of 4-butyloxyphenylacetylene and 10 ml of toluene is poured into the resultant, and a polymerization reaction is further performed at 30° C. for hour. After the polymerization has sufficiently progressed, a mixed solution of 1.74 g of 4-butyloxyphenylacetylene and 10 mmol of toluene is poured into the resultant again, and a polymerization reaction is further performed at 30° C. for 1 hour. Further, a mixed solution of 10 mmol of 4-butyloxyphenylacetylene and 10 ml of toluene is poured into the resultant again, and a polymerization reaction is further performed at 30° C. for 1 hour. After that, a mixed solution of 3 mmol of phenylacetylene and 3 ml of toluene is poured into the resultant, and a polymerization reaction is further performed at 30° C. for 1 hour.

The resultant polymer is washed with methanol and filtrated. After that, the polymer is dried for 24 hours in a vacuum, whereby poly((phenylacetylene)-co-(4-butyloxyphenylacetylene)-co-(phenylacetylene)-co-(4-butyloxyphenylacetylene)-co-(phenylacetylene)) as a target polyacetylene block polymer is obtained.

Example 10

The pressure in a test tube is reduced, the air in the test tube is replaced with nitrogen, and then the test tube is hermetically sealed. 0.01 mmol of a rhodium (norbornadiene) chloride dimer and 3 ml of toluene are placed into the test tube, and the mixture is stirred at 0° C. for 15 minutes. After that, 0.4 ml of a 0.1 mol/l solution of 1,1,2-triphenylvinyllithium in toluene is poured into the resultant mixture, and the whole is stirred for 30 minutes. After that, 0.6 ml of a 0.1 mol/l solution of triphenylphosphine in toluene is poured into the resultant mixture, and the whole is stirred for an additional 30 minutes.

A mixed solution of 6 mmol of phenylacetylene and 3 ml of toluene is poured into a solution of the rhodium complex obtained by the above-mentioned method in toluene, whereby a polymerization reaction is initiated. The reaction is performed at 30° C. for 30 minutes. After the polymerization has sufficiently progressed, a mixed solution of 7.5 mmol of 4-butylphenylacetylene and 10 ml of toluene is poured into the resultant, whereby a polymerization reaction is initiated. The reaction is performed at 30° C. for 30 minutes. After the polymerization has sufficiently progressed, 7.5 mmol of 4-butylphenylacetylene and 10 ml of toluene are poured into the resultant again, and a polymerization reaction is further performed at 30° C. for 1 hour.

After the polymerization has sufficiently progressed, 10 mmol of 4-(4'-phenylbutoxy)phenylacetylene and 20 ml of toluene are poured into the resultant, and a polymerization reaction is further performed at 30° C. for hour. After the polymerization has sufficiently progressed, 10 mmol of 4-(4'-phenylbutoxy)phenylacetylene and 20 ml of toluene are poured into the resultant again, and a polymerization reaction is further performed at 30° C. for 1 hour. After the polymerization has sufficiently progressed, 7.5 mmol of 4-butylphenylacetylene and 10 ml of toluene are poured into the resultant, and a polymerization reaction is further performed at 30° C. for 1 hour.

After the polymerization has sufficiently progressed, 7.5 mmol of 4-butylphenylacetylene and 10 ml of toluene are poured into the resultant again, and a polymerization reaction is further performed at 30° C. for hour. After the polymerization has sufficiently progressed, 6 mmol of phenylacetylene and 6 ml of toluene are poured into the resultant, and a polymerization reaction is further performed at 30° C. for 1 hour. The resultant polymer is washed with methanol and filtrated. After that, the polymer is dried for 24 hours in a vacuum, whereby poly(phenylacetylene-co-(4-butylphenylacetylene)-co-(4-(4'-phenylbutoxy)phenylacetylene)-co-((4-butylphenylacetylene)-co-phenylacetylene)) as a target polyacetylene block polymer is obtained.

Example 11

An example of a method of producing a device will be described.

Figure 12:
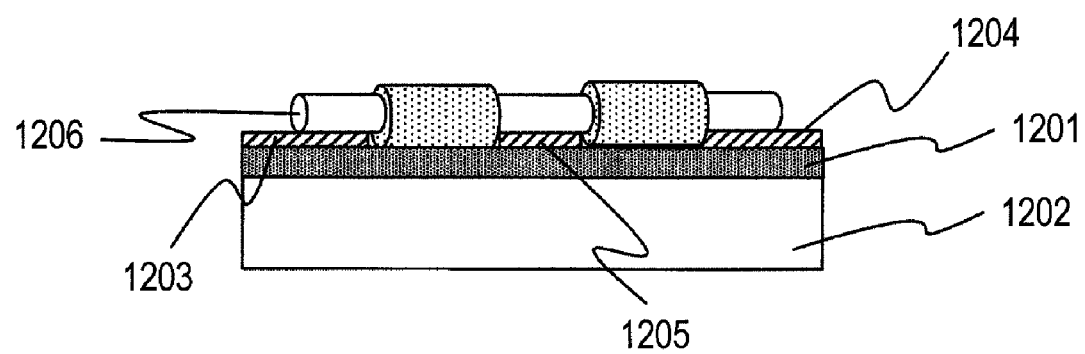
FIG. 12 is an outline view showing another embodiment of the device according to the present invention.

As shown in FIG. 12, the device according to this example is formed on a highly doped Si substrate 1202 having a thermal oxidation film 1201 having a thickness of 100 nm on its surface. Au electrodes 1203, 1204, and 1205 are formed by lithography employing electron beam exposure, and a distance between the electrodes is about 100 nm. The electrode 1205 has a width of about 100 nm. A 1.0 wt % solution is prepared by dissolving 10 mg of the polyacetylene block polymer obtained in Example 9 described above in 10 ml of chloroform, and is applied between the electrodes.

The solution is applied by a spin coating method onto the gold electrodes formed into a pattern on the silicon substrate, whereby a polyacetylene block polymer layer 1206 is formed. The polyacetylene block polymer to be used in this example has a length of about 350 nm, and a large number of molecules are brought into contact with both the electrodes 1203 and 1204, whereby intermolecular hopping conduction between the electrodes 1203 and 1204 is suppressed. In addition, when both terminals of the block polymer are in contact with the electrodes, there is a high probability that the conductive block in the middle of the block polymer is present on the gate electrode 1205. Accordingly, good electrical contact is established between the gate electrode 1205 and the block polymer, and a molecule is in electrical contact with the three electrodes independent of one another in a favorable fashion. In this device, an electrical current detected from each electrode can be controlled by controlling a voltage between the electrode 1203, the electrode 1204 and the electrode 1205.

Example 12

A device is produced by the same manner as in Example 11 except that the polyacetylene block polymer is changed to the polymer obtained in Example 10. In this device, the electrode 1205 operates as a gate electrode, and a current flowing between the electrodes 1203 and 1204 is controlled by the application of a voltage to the electrode 1205.

The block polymer of the present invention has an insulating coating portion and a conductive portion in its molecule, and can be used as a molecular wire that facilitates the injection of carriers between itself and an electrode. As a result, the block polymer can be utilized in an organic molecular device in which multiple electrodes which pair up with each other through the chain of the block polymer are placed, and the electrodes are bridged by one molecule.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-227020, filed Aug. 31, 2007, and Japanese Patent Application No. 2008-212169, filed Aug. 20, 2008, which are hereby incorporated by reference herein in their entirety.

What is claimed is:

1. A block polymer comprising an insulating block and at least two conductive blocks and having a main chain composed of spiral polyacetylene, wherein the insulating block has an insulating portion surrounding a conductive polyacetylene portion containing a part of the main chain and the insulating block is sandwiched between the conductive blocks.

2. A block polymer comprising insulating blocks and at least one conductive block and having a main chain composed of spiral polyacetylene, wherein the insulating blocks have insulating portions surrounding a conductive polyacetylene portion containing a part of the main chain and the at least one conductive block is sandwiched between the insulating blocks.

3. A block polymer comprising at least a conductive block having a main chain composed of spiral polyacetylene, wherein the conductive block has a conductive portion surrounding an insulating block having a main chain composed of spiral polyacetylene.

4. A device structure comprising a block polymer and a electrode, wherein the block polymer comprises an insulating block and a conductive block, and having a main chain composed of spiral polyacetylene, and wherein the insulating block has an insulating portion surrounding a conductive polyacetylene portion containing a part of the main chain and the conductive block is in contact with the electrode.

* * * * *